(12) United States Patent
Gallavan

(10) Patent No.: US 6,201,320 B1
(45) Date of Patent: *Mar. 13, 2001

(54) AUTOMATIC POWER TURN-ON CIRCUIT FOR A BATTERY-POWERED VOLTAGE MEASUREMENT APPARATUS

(75) Inventor: Michael F. Gallavan, Edmonds, WA (US)

(73) Assignee: Fluke Corporation, Everett, WA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/017,013

(22) Filed: Feb. 2, 1998

(51) Int. Cl.[7] ........................................... H02J 7/00
(52) U.S. Cl. .......................... 307/131; 307/130; 307/125
(58) Field of Search .......................... 307/112, 116, 307/125, 130, 131, 139, 140, 141, 141.1; 320/148, 149, 151, 152, 162–165

(56) References Cited

U.S. PATENT DOCUMENTS

| 4,537,516 | * | 8/1985 | Epstein | 374/1 |
|---|---|---|---|---|
| 5,028,806 | * | 7/1991 | Stewart et al. | 307/66 |
| 5,166,595 | * | 11/1992 | Leverich | 320/32 |
| 5,196,781 | * | 3/1993 | Jamieson et al. | 320/102 |
| 5,251,179 | * | 10/1993 | Wittman | 365/227 |
| 5,352,970 | * | 10/1994 | Armstrong, II | 320/39 |
| 5,408,149 | * | 4/1995 | Aneha et al. | 327/544 |
| 5,539,610 | * | 7/1996 | Williams | 361/256 |
| 5,877,618 | * | 3/1999 | Luebke et al. | 324/72.5 |
| 5,892,351 | * | 4/1999 | Faulk | 320/125 |
| 5,907,238 | * | 5/1999 | Owerko et al. | 323/349 |

* cited by examiner

Primary Examiner—Fritz Fleming
(74) Attorney, Agent, or Firm—Goege T. Noe

(57) ABSTRACT

An automatic power turn-on circuit for a battery-powered measurement instrument. Instrument power is normally off, and when the instrument is connected to a voltage to be measured, the voltage that is sensed activates an electronic switch that in turn connects an internal battery to the processing and display circuits of the instrument. The voltage sense circuitry includes circuits for sensing either a positive or a negative voltage, and biasing a driver transistor into conduction. The driver transistor in turn activates the switch to connect the battery voltage to a power supply output node. An RC network holds the switch in the "on" position for a short period of time after the voltage to be measured is removed from the inputs of the instrument.

4 Claims, 1 Drawing Sheet

AUTOMATIC POWER TURN-ON CIRCUIT FOR A BATTERY-POWERED VOLTAGE MEASUREMENT APPARATUS

BACKGROUND OF THE INVENTION

This invention relates generally to power supply circuits, and in particular to an automatic power turn-on circuit for a battery-powered voltage measurement apparatus.

Conventional battery-powered voltage measuring instruments, such as voltmeters and the like, typically have power switches that connect and disconnect internal batteries to and from measurement processing circuits in order for them to operate and display the measurement. Typically associated with this type of instrument is a pair of test leads, one for providing a common reference such as ground, and the other for receiving the voltage to be measured. An operator must first turn the power on and then touch the test leads to desired points in the electrical circuit being measured. Of course, all the time that the instrument is turned on, the batteries are draining. If the instrument is left on for an extended period of time without making measurements, or if the instrument is unintentionally left on, battery life is shortened appreciably.

Continuity checkers are known in the art that are powered by a circuit under test and do no more than energize an indicator light. Another prior art approach is that of the type that is taught in U.S. Pat. No. 3,919,631, which discloses a battery-powered leadless probe that detects the presence of voltage by means of a sensor or conductive tip connected to an electronic switch that connects a battery to a light bulb. These prior art devices merely indicate that a voltage is present, and turn off as soon as they are removed from the voltage field.

It would be desirable to provide a battery-powered apparatus capable of automatically turning on in order to provide measurement or indication of a number of different voltages over a predetermined voltage range. Moreover, it would be desirable to provide a battery-powered apparatus that would remain turned on for a predetermined time period following a voltage measurement so that a series of measurements could be made without the apparatus turning on and off for each measurement.

SUMMARY OF THE INVENTION

In accordance with the present invention, an automatic power turn-on circuit is provided for a battery-powered measurement instrument. Instrument power is normally off, conserving the power of an internal battery. When the input leads of the instrument are connected to a voltage potential to be measured or verified, or even when the input leads are touched together, the voltage potenial that is sensed thereby activates an electronic switch that in turn connects the battery power to the processing and display circuits of the instrument. The voltage sense circuitry includes circuits for sensing potentials of either a positive or a negative polarity, or ground, and biasing a driver transistor into conduction. The driver transistor in turn activates the switch to connect the battery voltage to a power supply output node. An RC network holds the switch in the "on" position for a short period of time after the voltage potential to be measured or verified is removed from the inputs of the instrument.

It is therefore one object of the present invention to provide an automatic power turn-on circuit for a battery powered measurement instrument.

It is another object to provide a measurement instrument that automatically turns on when its inputs are connected to a voltage potential to be measured or verified.

Other objects, features, and advantages of the present invention will become obvious to those having ordinary skill in the art upon a reading of the following description when taken in conjunction with the accompanying drawings.

DETAILED DESCRIPTION OF THE INVENTION

Figure 1:
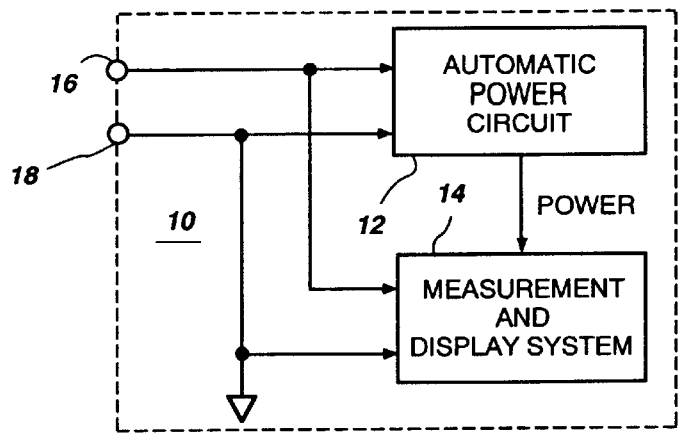
FIG. 1 is a schematic diagram of a measurement instrument incorporating an automatic power turn-on circuit in accordance with the present invention.

Referring now to FIG. 1 of the drawings, there is shown generally enclosed by a dashed line a measurement instrument 10 incorporating an automatic power turn-on circuit 12 in accordance with the present invention. Also contained within instrument 10 is a measurement-and-display system 14 which receives its operating power from automatic power circuit 12 to measure and display voltages that are placed across a pair of input terminals 16 and 18. Measurement-and-display system 14 may suitably any of a number of voltage measurement circuits that are well known in art of digital multimeters, or may be a circuit such as that described in co-pending application Ser. No. 09/026 934, filed Feb. 20, 1998 input terminals 16 and 18 may represent respectively a conventional input jack and a common or ground input receptacle to which test leads or probes may be connected.

Figure 2:
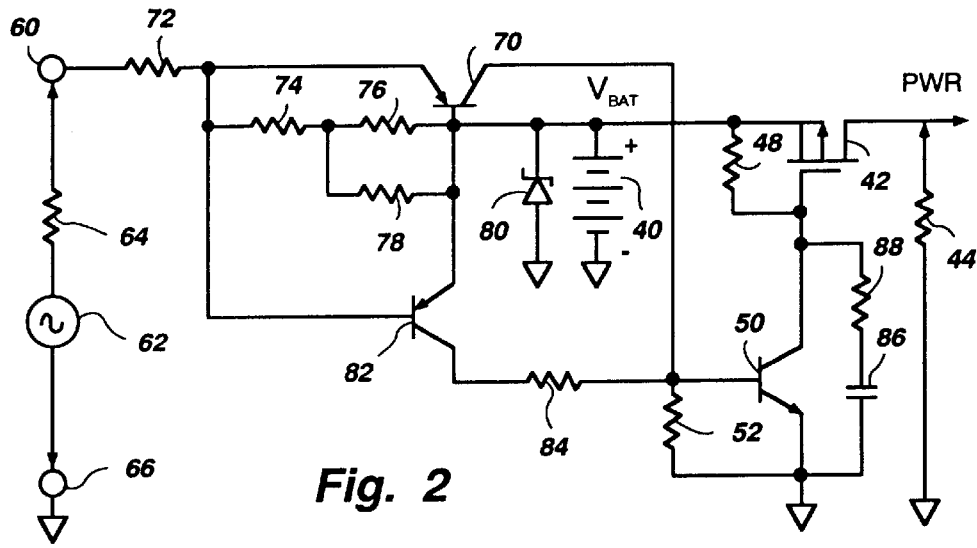
FIG. 2 is a schematic diagram of an automatic power turn-on circuit in accordance with the present invention.

The automatic power circuit 12 is shown in detail in FIG. 2. A battery 40 is connected to the source of an insulated-gate MOSFET (metal-oxide silicon field-effect transistor) 42, which functions as a switch and series pass element to connect or disconnect the voltage of battery 40 to a power (PWR) output. The drain of MOSFET 42 is shown connected to a load represented by a load resistor 44 in this circuit for purposes of discussion, however, as a practical matter, load resistor 44 may suitably be the measurement-and-display system 14 of FIG. 1.

Normally, MOSFET 42 is turned off and is non-conducting so that battery 40 is disconnected from the load 44. A resistor 48 is connected across the gate-to-source junction of MOSET 42, and in series with the collector of a driver transistor 50. MOSFET 42 is turned on whenever a positive voltage is developed across a resistor 52, and hence across the base-to-emitter junction of transistor 50, forward biasing transistor 50 and causing it to conduct current through resistor 48, in turn forward biasing MOSFET 42.

There are two ways that a positive voltage may be developed across resistor 52, and they both involve the polarity, either positive or negative, of input voltage applied to an input terminal 60 with respect to the battery voltage $V_{BAT}$ of battery 40.

In a first example, let us suppose that input terminal 60 is connected to a voltage potential that is positive with respect to battery voltage $V_{BAT}$, and that input terminal 66 is connected to ground. The source of voltage being measured is represented by a voltage source 62 and its internal impedance 64 connected between input terminal 60 and common terminal 66. The base potential of a transistor 70 is held at the battery voltage $V_{BAT}$ and the positive voltage at input terminal 60, which is greater than voltage $V_{BAT}$, causes current to flow through resistor 72 into bias resistors 74, 76, and 78, and the emitter of transistor 70, turning transistor 70 on. Transistor 70 operates as a common-base amplifier, sending collector current into resistor 52, developing a positive voltage thereacross to forward bias transistor 50, turning on MOSFET 42 as described above.

It should be pointed out that bias resistors 74, 76, and 78 could be replaced by a single resistor. In this embodiment, however, resistor 78 is a thermistor to provide temperature compensation. Also, a zener diode 80 may be placed across the battery 40 to protect the circuitry in case the battery is installed backwards, and also, zener diode 80 protects the battery from damage caused by high voltage.

In a second example, let us suppose that input terminal 60 is connected to a voltage that is negative with respect to the battery voltage $V_{BAT}$. Note that this voltage could be zero volts, such as would result in touching the input leads together, effectively shorting terminals 60 and 66 together, or the voltage could be a voltage potential of negative polarity. The emitter potential of a transistor 82 is held at the battery voltage $V_{BAT}$ and the negative voltage at input terminal 60, which is negative with respect to voltage $V_{BAT}$, causes current to flow through resistor 72 into bias resistors 74, 76, and 78, and the base-to-emitter junction of transistor 82, turning transistor 82 on. Transistor 82 operates as a common-emitter amplifier, sending collector current through load resistor 84 into resistor 52, developing a positive voltage thereacross to forward bias transistor 50, turning on MOSFET 42 as described above.

Thus, it can be discerned that MOSFET 42 functions as switch that turns on as soon as any voltage potential is applied across input terminals 60 and 66 thereby to provide operating power to the attendant measurement processing circuits of the measurement instrument.

In the embodiment of FIG. 2 so far described, as soon as a voltage source 62 is removed from the input terminals, transistor 50 loses its bias source and turns off, turning off MOSFET 42 along with it. To prevent the measurement instrument from turning on and off while an operator is making multilple measurements, such as checking several contacts of a connector block, for example, an RC circuit comprising a capacitor 86 and a resistor 88 are connected in series across the collector and emitter of transistor 50. Initially, with transistor 50 non-conducting and thus turned off, capacitor 86 charges to the battery voltage $V_{BAT}$. When transistor 50 turns on, the charge on capacitor 86 is removed through resistor 88 and transistor 50. After five RC time constants, capacitor 86 is fully discharged and has ground potential on both sides thereof. When voltage source 62 is removed, and transistor 50 turns off, its collector momentarily remains at ground potential because capacitor 86 cannot charge instantaneously. As capacitor 86 charges toward battery voltage $V_{BAT}$, however, the voltage drop across resistor 48 eventually decreases to the point that MOSFET 42 shuts off.

In a proposed commercial embodiment of the present invention, capacitor 86 has a value of 68 microfarads, resistor 88 has a value of 100 ohms, and resistor 48 has a value of three megohms. Thus, it can be seen that the combination of capacitor 86 and resistor 88 provide smooth turn-on of MOSFET 42 when a voltage is applied to inputs 60 and 66, and the combination of capacitor 86 and resistors 48 and 88 holds MOSFET 42 on for several minutes after removal of the input voltage.

Also, in the proposed commercial embodiment, the values of resistors 72 and 52 were chosen to be one megohm. Other values may be selected by circuit designers without undue experimentation, depending upon the intended operating environment.

It should also be pointed out that as shown and described herein, the input impedance looking into terminals 60 and 66 is relatively high. On the other hand, leakage current of battery 40 is kept to a minimum. If a different input impedance is desired, such as one megohm as is common in many measurement instruments, placing a parallel input resistor across terminals 60 and 66 will result in the undesirable effect of providing a current drain to ground through resistors 76, 74, 72, and the parallel input resistor, substantially shortening the battery life. A solution to this problem is shown in FIG. 3.

Figure 3:
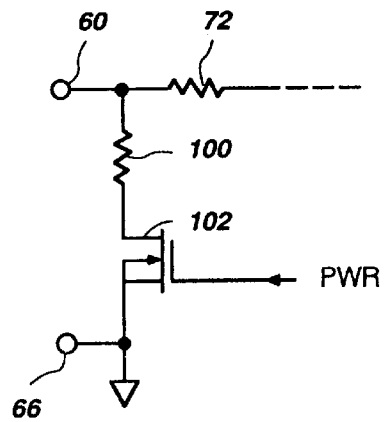
FIG. 3 is an alternative input impedance for the circuit of FIG. 2.

FIG. 3 shows an optional parallel input impedance in the form of resistor 100 connected across input terminals 60 and 66. A MOSFET 102 is interposed in series with resistor 100, and is turned on to connect ground potential to the bottom end of resistor 100 when MOSFET 42 turns on, applying PWR to the gate of MOSFET 102. When MOSFET 102 is turned off, the battery-drain leakage path to ground is blocked.

While I we have shown and described the preferred embodiment of my invention, it will be apparent to those skilled in the art that many changes and modifications may be made without departing from my invention in its broader aspects. It is therefore contemplated that the appended claims will cover all such changes and modifications as fall within the true scope of the invention.

What I claim as my invention is:

1. An automatic power turn-on circuit for a battery-powered voltage measurement apparatus, comprising:

an input terminal for receiving an external voltage from an external voltage source;

a switch for connecting and disconnecting a battery to and from a load;

a driver circuit coupled to said switch, said driver circuit when turned on activates said switch and connects said battery to said load, said driver circuit when turned off deactivates said switch and disconnects said battery from said load; and a voltage sensing resistor disposed between said input terminal and said driver circuit, said voltage sensing resistor a difference between said external voltage and a voltage provided by said battery, and generating current in response thereto to turn on said driver circuit and thereby activate said switch, said driver circuit turning off when said external voltage is removed.

2. An automatic power turn-on circuit in accordance with claim 1 further comprising a voltage polarity sensing circuit connected between said voltage sensing resistor and said driver circuit.

3. An automatic power turn-on circuit in accordance with claim 2 wherein said voltage polarity sensing circuit senses the polarity of said external voltage with respect to voltage of said battery.

4. An automatic power turn-on circuit in accordance with claim 1 further comprising an RC network connected to said driver circuit for holding said switch in an activated state for a predetermined period following turn-off of said driver circuit.

* * * * *